(12) United States Patent
Parsa et al.

(10) Patent No.: US 11,193,990 B2
(45) Date of Patent: Dec. 7, 2021

(54) INTEGRATED MICROFABRICATED ALKALI VAPOR CELL SENSOR WITH REDUCED HEADING ERROR

(71) Applicant: Texas Instruments Incorporated, Dallas, TX (US)

(72) Inventors: Roozbeh Parsa, Portola Valley, CA (US); David Brian McDonald, Sunnyvale, CA (US); Ann Gabrys, Woodside, CA (US); Paul Mawson, Fort Collins, CO (US); Anston Joel Lobo, Sunnyvale, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 287 days.

(21) Appl. No.: 15/621,088

(22) Filed: Jun. 13, 2017

(65) Prior Publication Data

US 2018/0306876 A1    Oct. 25, 2018

Related U.S. Application Data

(60) Provisional application No. 62/487,350, filed on Apr. 19, 2017.

(51) Int. Cl.
*G01R 33/26* (2006.01)
(52) U.S. Cl.
CPC .................................. *G01R 33/26* (2013.01)
(58) Field of Classification Search
CPC .... G01R 33/26; G01R 33/022; G01R 33/323; G01R 33/0322; G01R 33/24
See application file for complete search history.

(56) References Cited

U.S. PATENT DOCUMENTS

| | | | |
|---|---|---|---|
| 3,257,608 A | 6/1966 | Bell | |
| 3,778,700 A | 12/1973 | Bayley | |
| 3,873,908 A | 3/1975 | Young | |
| 4,327,327 A | 4/1982 | Greenwood | |
| 4,731,581 A | 3/1988 | Doriath | |
| 8,054,074 B2 | 11/2011 | Ichihara | |
| 8,212,556 B1 | 7/2012 | Schwindt | |
| 8,362,768 B2 | 1/2013 | Nagasaka | |
| 8,405,389 B2 | 3/2013 | Sugioka | |
| 8,957,677 B2 | 2/2015 | Nagasaka | |

(Continued)

*Primary Examiner* — Patrick Assouad
*Assistant Examiner* — Haidong Zhang
(74) *Attorney, Agent, or Firm* — Jacqueline J. Garner; Charles A. Brill; Frank D. Cimino

(57) ABSTRACT

An integrated microfabricated alkali vapor cell sensor includes two alkali vapor regions, with a signal path through each. One or two signal emitters, with associated optical signal rotators, such as quarter wave plates, provide circularly polarized input signals into the alkali vapor regions, so that a first signal through the first alkali vapor region is circularly polarized in an opposite direction from a second signal through the second alkali vapor region. Output signals from the two alkali vapor regions are transformed to linearly polarized signals and then measured by one or more signal detectors. A first Larmor frequency is estimated from the output signal from the first alkali vapor region, and a second Larmor frequency is estimated from the output signal from the second alkali vapor region. A heading error-free Larmor frequency is estimated from the first Larmor frequency and the second Larmor frequency.

28 Claims, 5 Drawing Sheets

(56) References Cited

U.S. PATENT DOCUMENTS

| | | |
|---|---|---|
| 9,351,651 B2 | 5/2016 | Nagasaka |
| 2005/0184815 A1* | 8/2005 | Lipp .................... G04F 5/14 |
| | | 331/94.1 |
| 2011/0193555 A1* | 8/2011 | Sugioka ............... G01R 33/022 |
| | | 324/244.1 |
| 2013/0127458 A1 | 5/2013 | Mizutani |
| 2013/0214780 A1 | 8/2013 | Smith |
| 2014/0368193 A1* | 12/2014 | Morales ................ G01R 33/26 |
| | | 324/304 |
| 2015/0027908 A1* | 1/2015 | Parsa .................... F17C 3/00 |
| | | 206/0.7 |

\* cited by examiner

INTEGRATED MICROFABRICATED ALKALI VAPOR CELL SENSOR WITH REDUCED HEADING ERROR

CROSS-REFERENCE TO RELATED APPLICATIONS

The present application claims the benefit of U.S. Provisional Application 62/487,350 filed Apr. 19, 2017.

FIELD

This disclosure relates to the field of microfabricated alkali vapor cell sensors.

BACKGROUND

Microfabricated alkali vapor magnetometers enable sensitive magnetic field measurements in a variety of applications requiring a small form factor and low power requirements. Measurements of the amplitudes of the magnetic fields are affected by the orientation of the magnetic field with respect to the signal axis of the magnetometer, that is, the axis of the signal through the alkali metal vapor, leading to errors in the measured values, referred to as heading errors. Reduction of heading errors in microfabricated alkali vapor magnetometers has been problematic.

SUMMARY

The present disclosure introduces a system for reducing heading errors in integrated microfabricated alkali vapor cell sensors. In one aspect, the disclosed system includes an integrated microfabricated alkali vapor cell sensor having a first alkali vapor region configured for a first input signal with a magnetic field rotating in a first direction and a second alkali vapor region configured for a second signal with a magnetic field rotating in a second, opposite, direction. In another aspect, the disclosed system involves an integrated microfabricated alkali vapor cell sensor configured to provide electromagnetic signals with opposing rotation directions through alkali vapor regions of a sensor cell.

Figure 2:
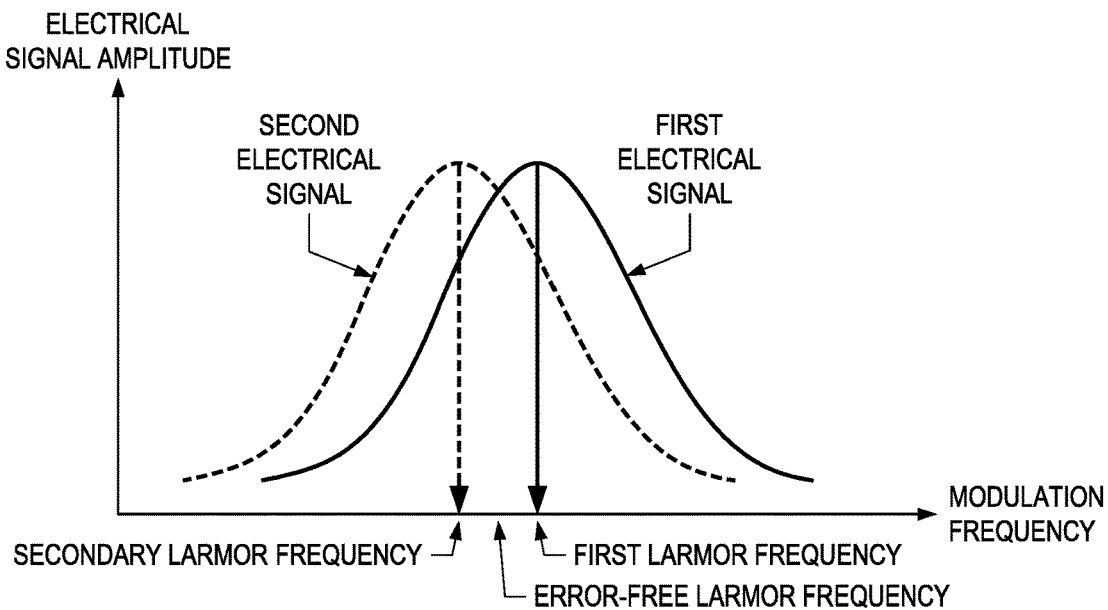

A chart of examples of the first electrical signal and the second electrical signal as functions of the modulation frequency is shown in FIG. 2.

Figure 3:
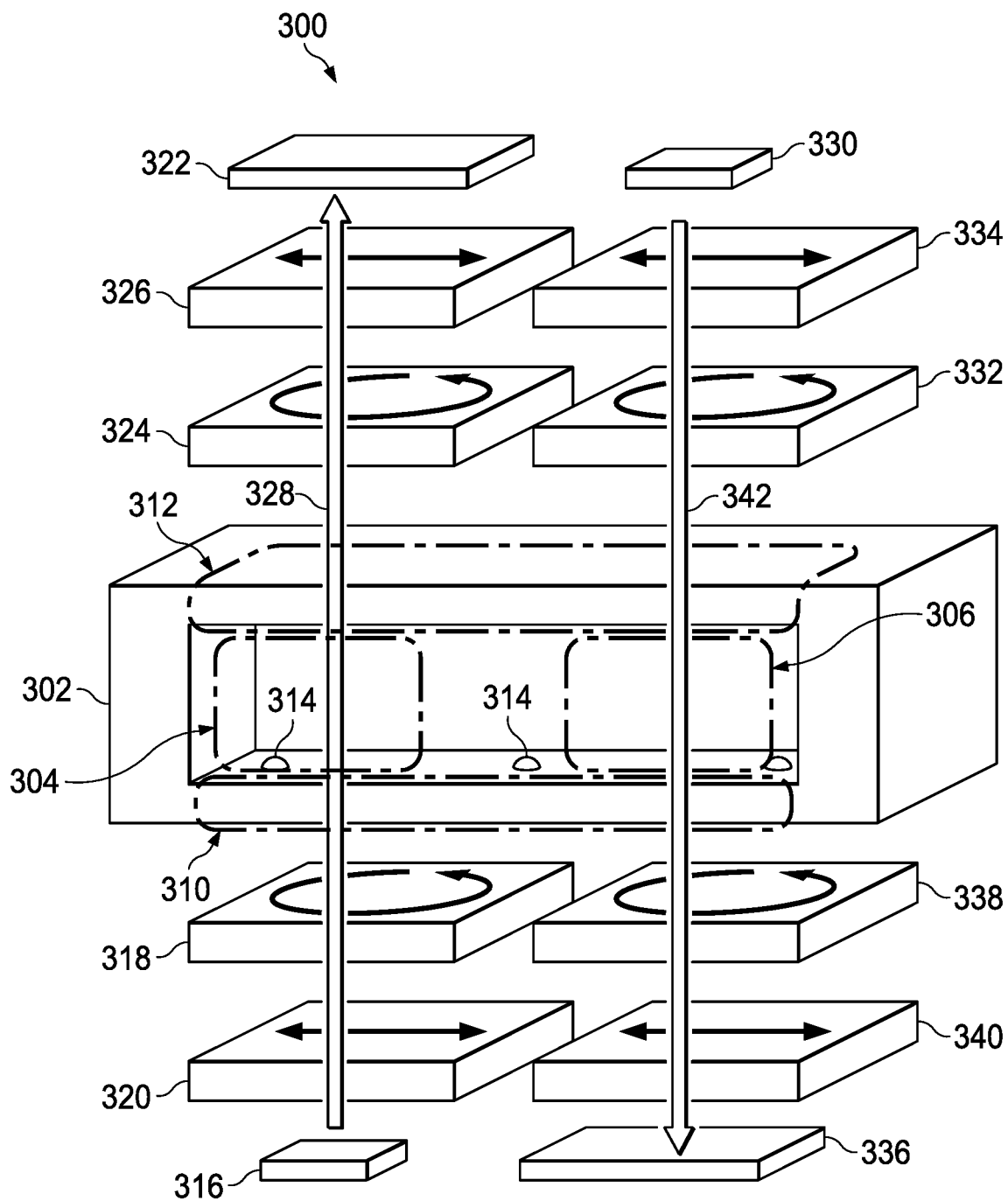

FIG. 3 is a cross section of another example integrated microfabricated alkali vapor sensor.

Figure 4:
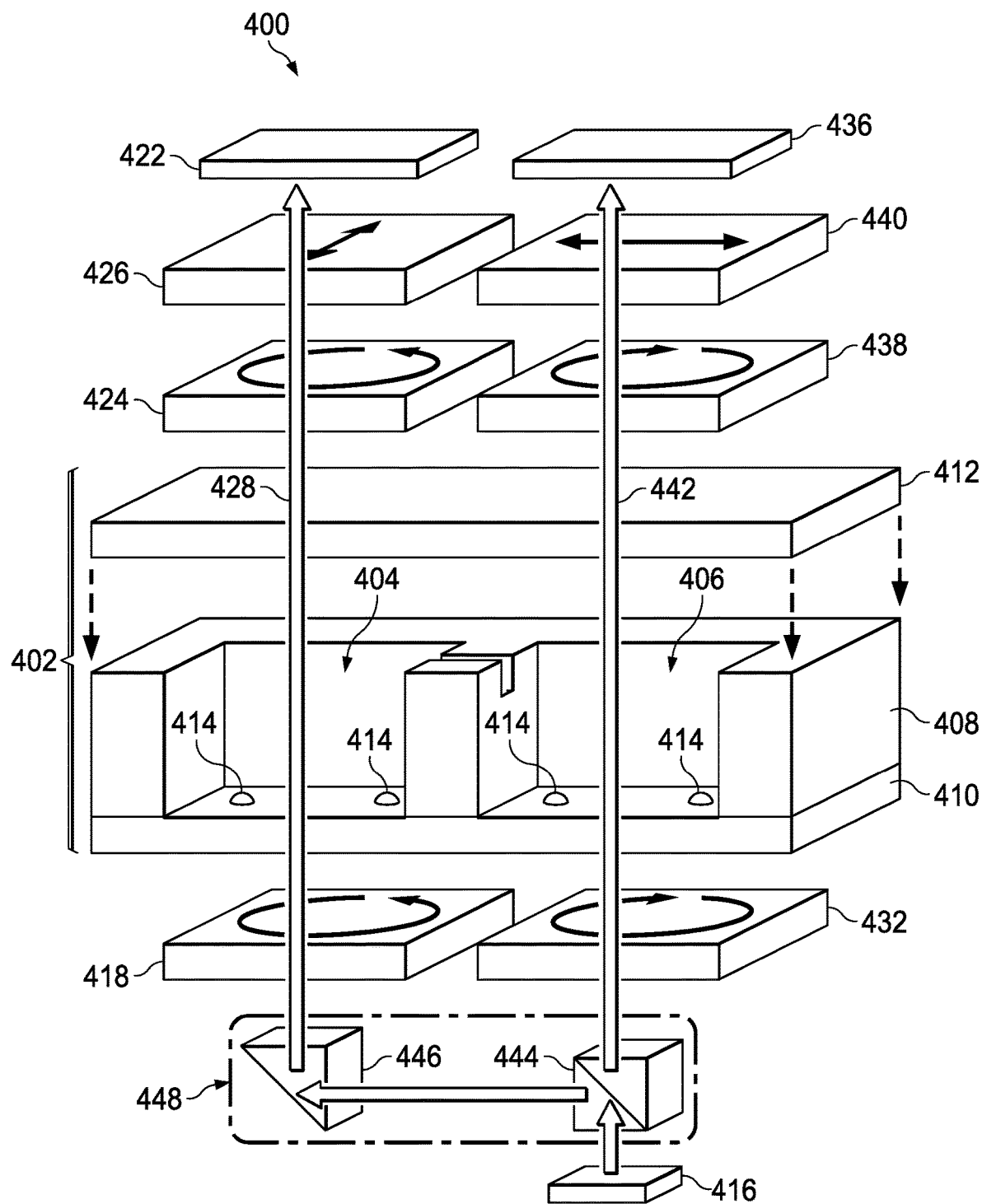

FIG. 4 is a cross section of another example integrated microfabricated alkali vapor sensor.

Figure 5:
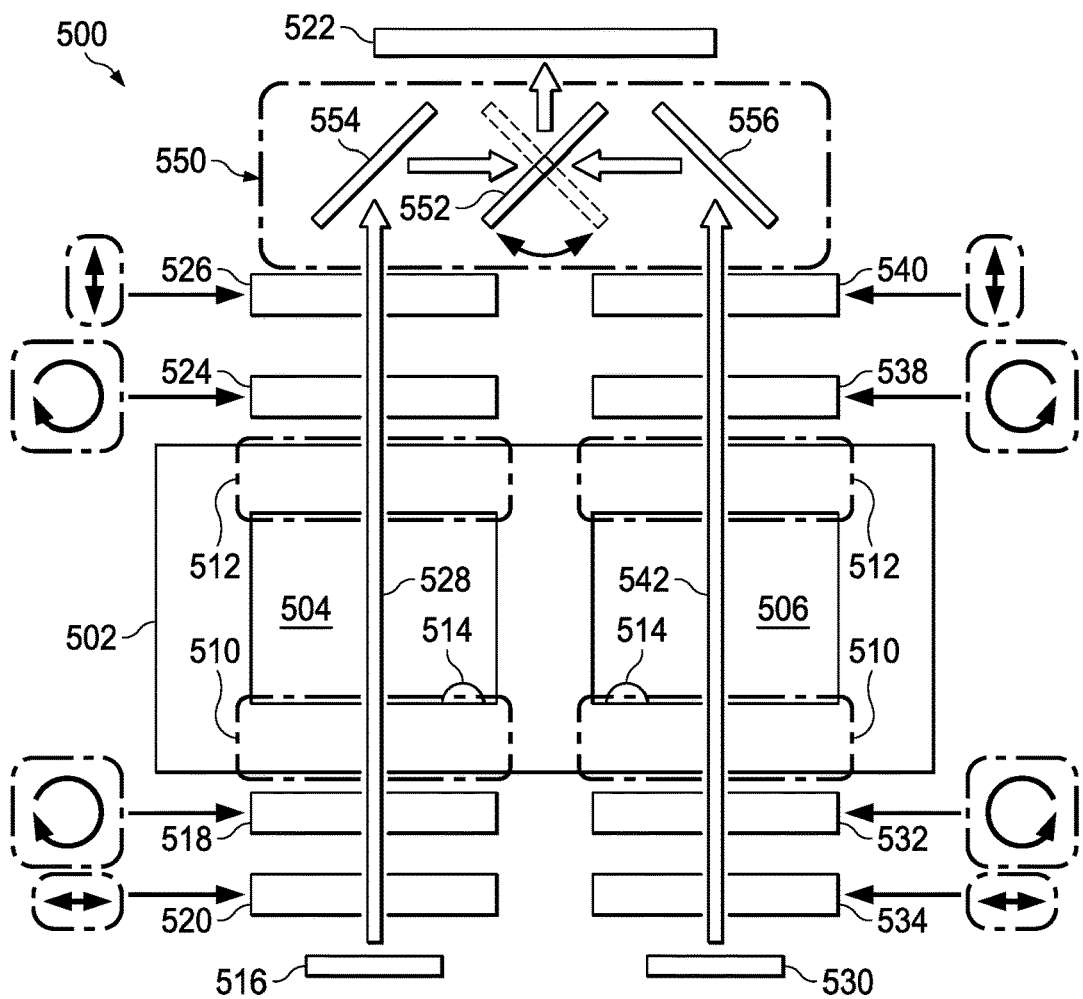

FIG. 5 is a cross section of a further example integrated microfabricated alkali vapor sensor.

Figure 6:
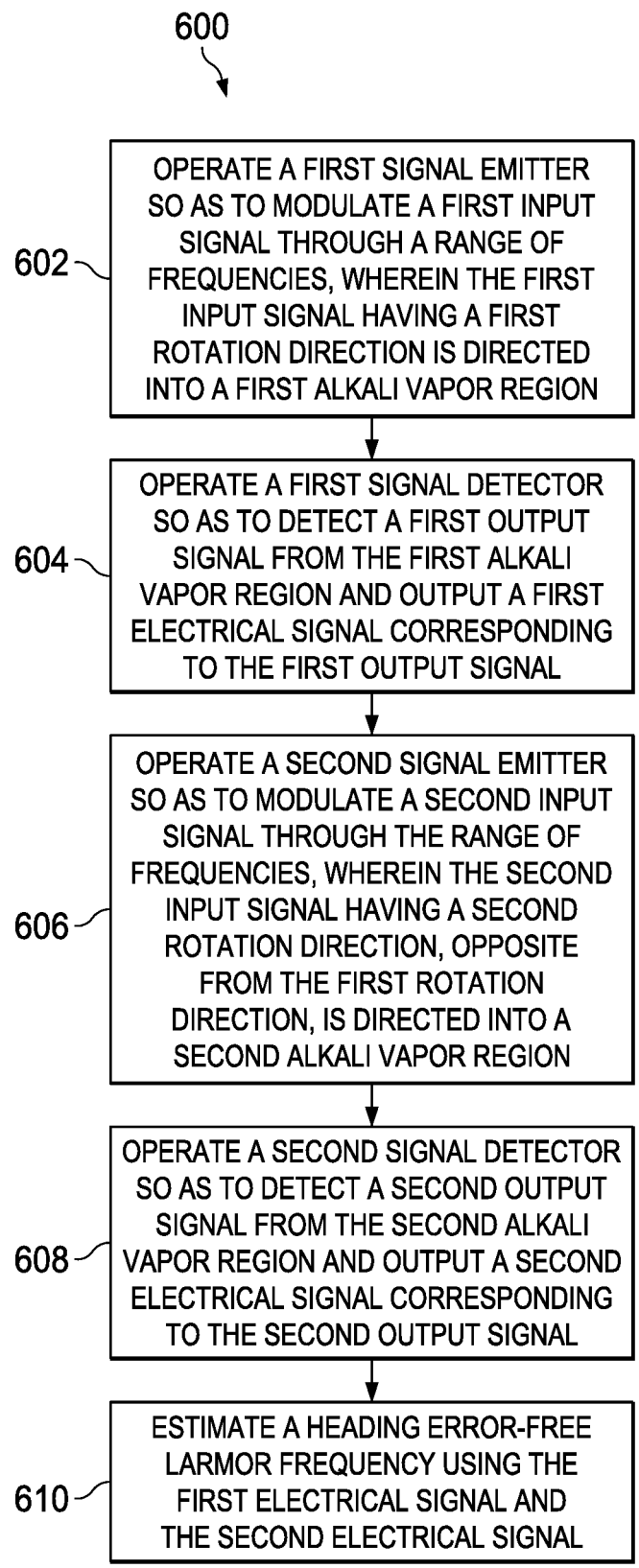

FIG. 6 is a flowchart of an example method of operating an integrated sensor.

DETAILED DESCRIPTION

The present disclosure is described with reference to the attached figures. The figures are not drawn to scale and they are provided merely to illustrate the disclosure. Several aspects of the disclosure are described below with reference to example applications for illustration. It should be understood that numerous specific details, relationships, and methods are set forth to provide an understanding of the disclosure. The present disclosure is not limited by the illustrated ordering of acts or events, as some acts may occur in different orders and/or concurrently with other acts or events. Furthermore, not all illustrated acts or events are required to implement a methodology in accordance with the present disclosure.

An alkali vapor sensor provides a frequency signal which is characteristic of electron energy transitions in alkali atoms irradiated by a circularly polarized pump signal. The alkali vapor sensor may be employed, for example, as a magnetometer to measure an amplitude of a magnetic field. Heading errors during operation of the alkali vapor sensor are due to magnetic fields that have non-zero components in a direction of the pump signal through an alkali vapor region containing the alkali atoms. Heading errors may be reduced by averaging frequency values obtained by pump signals with opposite rotations of circular polarization. It is particularly advantageous to reduce heading errors in integrated microfabricated alkali vapor sensors, to provide increased sensitivity and accuracy in mobile and low power applications. Microfabricated alkali vapor sensors have sensor cells containing the alkali atoms; the sensor cells have dimensions of a few millimeters to ten millimeters, and are fabricated in a microelectronic fabrication facility, for example using integrated circuit fabrication processes, micro mechanical electrical systems (MEMS) processes, and wafer level packaging (WLP) processes. Integrated microfabricated alkali vapor sensors have signal emitters and signal detectors located within a few millimeters of the sensor cells, as part of an assembled sensor unit. Integrated microfabricated alkali vapor sensors thus provide small form factors and low power requirements at low fabrication costs, advantageously enabling mobile and low power applications.

For the purposes of this disclosure, the terms "lateral" and "laterally" are understood to refer to a direction parallel to a plane of a top surface of the integrated microfabricated alkali vapor sensor or the sensor cell. For the purposes of this disclosure, it will be understood that, if an element is referred to as being "adjacent" to another element, it may be directly adjacent to the other element, or intervening elements may be present. If an element is referred to as being "directly adjacent" to another element, it is understood there are no other intentionally disposed intervening elements present. Other terms used to describe relationships between elements should be interpreted in like fashion, for example, "between" versus "directly between," and so on.

Figure 1:
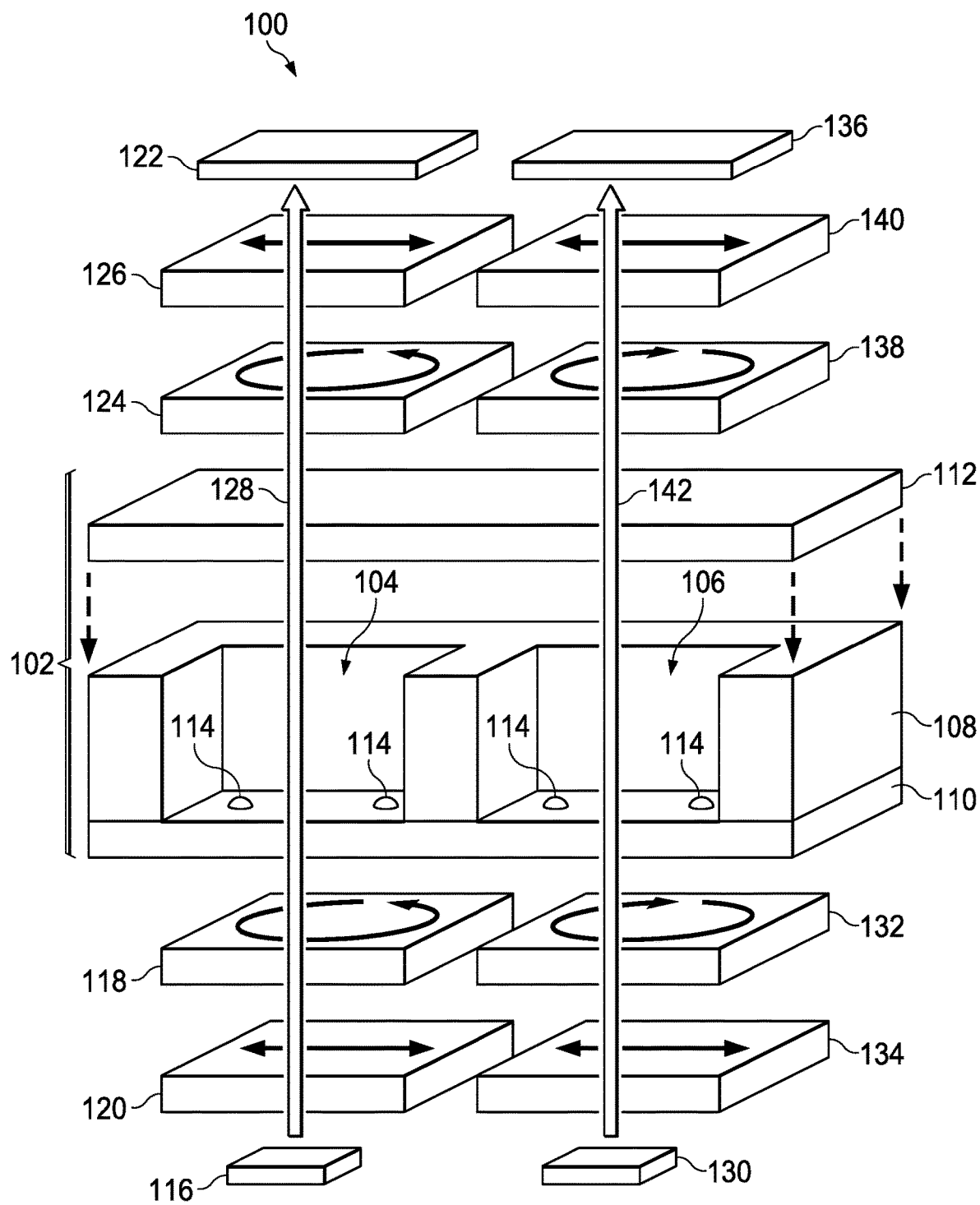
FIG. 1 is a cross section of an example integrated microfabricated alkali vapor sensor.

FIG. 1 is a cross section of an example integrated microfabricated alkali vapor sensor. The integrated microfabricated alkali vapor sensor 100, referred to herein as the integrated sensor 100, includes a sensor cell 102 having a first alkali vapor region 104 and a second alkali vapor region 106. The first alkali vapor region 104 and the second alkali vapor region 106 may be isolated from each other by a portion of the sensor cell 102, as depicted in FIG. 1. Alternately, the first alkali vapor region 104 and the second alkali vapor region 106 may be in fluid communication with each other. The sensor cell 102 may be implemented as a cell body 108 with a first window 110 attached to the cell body 108 and a second window 112 attached to the cell body 108 at a location opposite from the first window 110. The cell body 108 may laterally surround the first alkali vapor region 104 and the second alkali vapor region 106, as depicted in FIG. 1. The first window 110 and the second window 112 may each be exposed to the first alkali vapor region 104 and the second alkali vapor region 106, as depicted in FIG. 1.

There may be alkali metal 114, such as cesium or rubidium, disposed in the first alkali vapor region 104 and the second alkali vapor region 106, for example, in the form of condensed metal or in the form of a metal salt, such as cesium azide or rubidium azide. For the purposes of this disclosure, references to alkali metal are understood to include alkali metal in any form, for example, in a solid phase, in a liquid phase, or in a chemical compound such as a salt.

In the instant example, the integrated sensor 100 includes a first signal emitter 116 located outside of the first alkali vapor region 104, adjacent to, and within a few millimeters of, the first window 110. For the purposes of this disclosure, the term "few millimeters" will be understood to mean up to 10 millimeters. The first signal emitter 116 may include, for example, a diode laser such as a vertical cavity surface emitting laser (VCSEL) configured to emit a first input signal having a wavelength corresponding to an electron orbital transition in atoms of the alkali metal 114 in a vapor state. For example, in an implementation of the integrated sensor 100 in which the alkali metal 114 includes cesium, the first signal emitter 116 may emit at a wavelength of approximately 852 nanometers. In an implementation of the integrated sensor 100 in which the alkali metal 114 includes rubidium, the first signal emitter 116 may emit at a wavelength of approximately 780 nanometers.

A first input optical rotator 118 is located between the first signal emitter 116 and the first window 110. The first input optical rotator 118 is configured to transform the first input signal from the first signal emitter 116 so that a magnetic field of the first input signal rotates in a first rotation direction through the first alkali vapor region 104, that is, from a linearly polarized signal to a circularly polarized signal with the first rotation direction. The first input optical rotator 118 may include, for example, a quarter wave plate (QWP). Other elements within the first input optical rotator 118 to provide the rotation of the magnetic field of the first input signal are within the scope of the instant example. In one version of the instant example, the first input signal from the first signal emitter 116 may be linearly polarized, for example as a result of the architecture of the first signal emitter 116. In another version, in which the first input signal from the first signal emitter 116 is not polarized, a first linear polarizer 120 may be disposed between the first signal emitter 116 and the first input optical rotator 118.

In the instant example, the integrated sensor 100 includes a first signal detector 122 located outside of the first alkali vapor region 104, adjacent to, and within a few millimeters of, the second window 112. The first signal detector 122 may include, for example, a photodiode of silicon or other semiconductor material appropriate for detecting a first output signal from the first alkali vapor region 104. A first output optical rotator 124, for example a quarter wave plate having a same rotational orientation, or handedness, as the first input optical rotator 118, is located between the first signal detector 122 and the second window 112. The first output optical rotator 124 is configured to transform the first output signal from a circularly polarized signal back to a linearly polarized signal. Other elements within the first input optical rotator 118 to transform the first output signal to a linearly polarized signal are within the scope of the instant example. A first analyzer 126 is located between the first output optical rotator 124 and the first signal detector 122.

The first signal emitter 116, the first input optical rotator 118, the first linear polarizer 120, if present, the first signal detector 122, the first output optical rotator 124, and the first analyzer 126 are integrated into the integrated sensor 100, that is mounted on structural members, such as interposers and standoffs, of the integrated sensor 100. A first signal path 128 extends from the first signal emitter 116, through the first linear polarizer 120, through the first input optical rotator 118, through the first window 110, through the first alkali vapor region 104, through the second window 112, through the first output optical rotator 124, through the first analyzer 126, to the first signal detector 122. Passive optical elements such as lenses or reflectors may be present in the first signal path 128.

In the instant example, the integrated sensor 100 includes a second signal emitter 130, a second input optical rotator 132, and optionally a second linear polarizer 134 located outside of the second alkali vapor region 106, adjacent to, and within a few millimeters of, the first window 110. Thus, the first signal emitter 116 and the second signal emitter 130 are located on a same side of the sensor cell 102. The second signal emitter 130 is configured to emit a second input signal similar to the first input signal. The second signal emitter 130, the second input optical rotator 132, the second linear polarizer 134 are arranged with respect to the second alkali vapor region 106 similarly to the first signal emitter 116, the first input optical rotator 118, and the first linear polarizer 120 with respect to the first alkali vapor region 104, as depicted in FIG. 1. Furthermore in the instant example, the integrated sensor 100 includes a second signal detector 136, a second output optical rotator 138, and a second analyzer 140 located outside of the second alkali vapor region 106, adjacent to, and within a few millimeters of, the second window 112. The second signal detector 136, the second output optical rotator 138, and the second analyzer 140 are arranged with respect to the second alkali vapor region 106 similarly to the first signal detector 122, the first output optical rotator 124, and the first analyzer 126 with respect to the first alkali vapor region 104, as depicted in FIG. 1. A second signal path 142 extends from the second signal emitter 130, through the second linear polarizer 134, through the second input optical rotator 132, through the first window 110, through the second alkali vapor region 106, through the second window 112, through the second output optical rotator 138, through the second analyzer 140, to the second signal detector 136. The first signal path 128 through the first alkali vapor region 104 is parallel to the second signal path 142 through the second alkali vapor region 106. In the instant example. The first signal path 128 through the first alkali vapor region 104 and the second signal path 142 through the second alkali vapor region 106 point in a same direction. The second input optical rotator 132 is configured to transform the second input signal from the second signal emitter 130 so that a magnetic field of the second input signal rotates in a second rotation direction, opposite to the first direction of rotation of the first input signal, through the second alkali vapor region 106, that is, from a linearly polarized signal to a circularly polarized signal with the second rotation direction. The first input optical rotator 118 may be a right hand QWP, and the second input optical rotator 132 may be a left hand QWP, as indicated in FIG. 1.

During operation of the integrated sensor 100, the first input signal from the first signal emitter 116, and the second input signal from the second signal emitter 130, are modulated through a range of frequencies centered around a frequency corresponding to a difference in energy levels of a hyperfine split of the alkali atoms in a ground state. For example, in an implementation of the integrated sensor 100 in which the alkali metal 114 includes cesium, the modulation range of frequencies may be centered around a frequency of approximately 9.2 gigahertz (GHz). In an implementation of the integrated sensor 100 in which the alkali metal 114 includes rubidium, the modulation range of frequencies may be centered around a frequency of approximately 6.8 GHz. An amplitude of the first output signal reaching the first signal detector 122 may be a function of the modulation frequency of the first signal emitter 116. The first signal detector 122 may provide a first electrical signal corresponding to the first output signal reaching the first signal detector 122. Similarly, the second signal detector 136 may provide a second electrical signal corresponding to the second output signal reaching the second signal detector 136, which may be a function of the modulation frequency of the second signal emitter 130.

A chart of examples of the first electrical signal and the second electrical signal as functions of the modulation frequency is shown in FIG. 2. The first electrical signal has a local extremum at a modulation frequency referred to as the first Larmor frequency. Similarly, the second electrical signal has a local extremum at a modulation frequency referred to as the second Larmor frequency, which is different from the first Larmor frequency. Both the first Larmor frequency and the second Larmor frequency are affected by heading errors. A heading error-free Larmor frequency, which corresponds to an amplitude of the external magnetic field perpendicular to the first signal path 128 through the first alkali vapor region 104, and perpendicular to the second signal path 142 through the second alkali vapor region 106, is between the first Larmor frequency and the second Larmor frequency. The heading error-free Larmor frequency may be estimated, for example, as an average of the first Larmor frequency and the second Larmor frequency.

In another version of the instant example, the sensor cell 102 of FIG. 1 may have one or more additional alkali vapor regions, with corresponding signal paths, and associated signal emitters, signal detectors, and optical elements. During operation of the integrated sensor 100, electrical signals obtained from the additional alkali vapor regions may be combined with the first electrical signal and the second electrical signal to further improve an accuracy of the estimate of the heading error free Larmor frequency.

FIG. 3 is a cross section of another example integrated microfabricated alkali vapor sensor. The integrated microfabricated alkali vapor sensor 300, referred to herein as the integrated sensor 300, includes a sensor cell 302 having a first alkali vapor region 304 and a second alkali vapor region 306. The first alkali vapor region 304 and the second alkali vapor region 306 may be directly adjacent to each other, as depicted in FIG. 3. Alternately, the first alkali vapor region 304 and the second alkali vapor region 306 may be in fluid communication with each other, or isolated from each other. The sensor cell 302 may be implemented with a first window section 310 and a second window section 312 at a location opposite from the first window section 310. The sensor cell 302 may surround the first alkali vapor region 304 and the second alkali vapor region 306, as depicted in FIG. 3. The first window section 310 and the second window section 312 may each be exposed to the first alkali vapor region 304 and the second alkali vapor region 306, as depicted in FIG. 3. There may be alkali metal 314, such as cesium or rubidium, disposed in the first alkali vapor region 304 and the second alkali vapor region 306.

In the instant example, the integrated sensor 300 includes a first signal emitter 316 located outside of the first alkali vapor region 304, adjacent to, and within a few millimeters of, the first window section 310. The first signal emitter 316 may be configured to provide a first input signal having a wavelength corresponding to an electron orbital transition in atoms of the alkali metal 314 in a vapor state. A first input optical rotator 318 is located between the first signal emitter 316 and the first window section 310. An optional first linear polarizer 320 may be disposed between the first signal emitter 316 and the first input optical rotator 318.

In the instant example, the integrated sensor 300 includes a first signal detector 322 located outside of the first alkali vapor region 304, adjacent to, and within a few millimeters of, the second window section 312. A first output optical rotator 324 having a same rotational orientation as the first input optical rotator 318 is located between the first signal detector 322 and the second window section 312. A first analyzer 326 is located between the first output optical rotator 324 and the first signal detector 322.

The first signal emitter 316, the first input optical rotator 318, the first linear polarizer 320, if present, the first signal detector 322, the first output optical rotator 324, and the first analyzer 326 are integrated into the integrated sensor 300. A first signal path 328 extends from the first signal emitter 316, through the first linear polarizer 320, through the first input optical rotator 318, through the first window section 310, through the first alkali vapor region 304, through the second window section 312, through the first output optical rotator 324, through the first analyzer 326, to the first signal detector 322.

In the instant example, the integrated sensor 300 includes a second signal emitter 330 located outside of the second alkali vapor region 306, adjacent to, and within a few millimeters of, the second window section 312. Thus, the first signal emitter 316 and the second signal emitter 330 are located on opposite sides of the sensor cell 302. A second input optical rotator 332 is located between the second signal emitter 330 and the second window section 312, and optionally a second linear polarizer 334 may be located outside of the second alkali vapor region 306, between the second input optical rotator 332 and the second signal emitter 330. The integrated sensor 300 includes a second signal detector 336 located outside of the second alkali vapor region 306, adjacent to, and within a few millimeters of, the first window section 310. A second output optical rotator 338 having a same rotational orientation as the second input optical rotator 332 is located between the second signal detector 336 and the first window section 310, and a second analyzer 340 is located between the second signal detector 336 and the second output optical rotator 338. A second signal path 342 extends from the second signal emitter 330, through the second linear polarizer 334, through the second input optical rotator 332, through the second window section 312, through the second alkali vapor region 306, through the first window section 310, through the second output optical rotator 338, through the second analyzer 340, to the second signal detector 336. The first signal path 328 through the first alkali vapor region 304 is parallel to the second signal path 342 through the second alkali vapor region 306. In the instant example, the first signal path 328 through the first alkali vapor region 304 and the second signal path 342 through the second alkali vapor region 306 point in opposite directions.

The second input optical rotator 332 is configured to transform the second input signal from the second signal emitter 330 so that a magnetic field of the second input signal rotates in a second rotation direction, opposite to the first direction of rotation of the first input signal, through the second alkali vapor region 306, that is, from a linearly polarized signal to a circularly polarized signal with the second rotation direction. In the instant example, the first input optical rotator 318 may be a right hand QWP, and the second input optical rotator 332 may also be a right hand QWP, as indicated in FIG. 3. Alternatively, the first input optical rotator 318 may be a left hand QWP, and the second input optical rotator 332 may also be a left hand QWP. The same handedness of the first input optical rotator 318 and the second input optical rotator 332 in the instant example is due to the first signal path 328 and the second signal path 342 extending in opposite directions through the first alkali vapor region 304 and the second alkali vapor region 306. Operation of the integrated sensor 300 may proceed as disclosed in reference to FIG. 1 and FIG. 2, to obtain an estimate of a heading error-free Larmor frequency.

FIG. 4 is a cross section of another example integrated microfabricated alkali vapor sensor. The integrated microfabricated alkali vapor sensor 400, referred to herein as the integrated sensor 400, includes a sensor cell 402 having a first alkali vapor region 404 and a second alkali vapor region 406. The first alkali vapor region 404 and the second alkali vapor region 406 may be in fluid communication with each other, as depicted in FIG. 4. Alternately, the first alkali vapor region 404 and the second alkali vapor region 406 may be directly adjacent to each other, or isolated from each other. The sensor cell 402 may be implemented with a cell body 408 sandwiched between a first window 410 and a second window 412 at a location opposite from the first window 410. The cell body 408 may surround the first alkali vapor region 404 and the second alkali vapor region 406, as depicted in FIG. 4. The first window 410 and the second window 412 may each be exposed to the first alkali vapor region 404 and the second alkali vapor region 406, as depicted in FIG. 4. There may be alkali metal 414, such as cesium or rubidium, disposed in the first alkali vapor region 404 and the second alkali vapor region 406.

In the instant example, the integrated sensor 400 includes a single signal emitter 416 located outside of the sensor cell 402, adjacent to, and within a few millimeters of, the first window 410. The signal emitter 416 emits an input signal that is unpolarized. The signal emitter 416 is configured to emit the input signal into a polarizing beamsplitter 444. The polarizing beamsplitter 444 is configured to pass a first linearly polarized component of the input signal to the first alkali vapor region 404, possibly through optical elements such as a reflector 446 or lens, not shown. The polarizing beamsplitter 444 is further configured to pass a second linearly polarized component of the input signal to the second alkali vapor region 406, possibly through optical elements, not shown. A polarization orientation of the second linearly polarized component is perpendicular to a polarization orientation of the first linearly polarized component. A combination of the polarizing beamsplitter 444 and the reflector 446 provide an example of an input signal divider 448 which may be realized with other structures. The input signal divider 448 of FIG. 4 is provided as an example. Other structures for the input signal divider 448, for example structures which include separate reflectors, linear polarizers, or lenses, are within the scope of the instant example.

A first input optical rotator 418 is located between the input signal divider 448 and the first window 410. A second input optical rotator 432 is located between the input signal divider 448 and the first window 410. The first input optical rotator 418 and the second input optical rotator 432 are configured to transform the first linearly polarized component and the second linearly polarized component, respectively, to a first circularly polarized component and a second circularly polarized component, respectively, having opposite directions of rotation. This may be accomplished by having the first input optical rotator 418 include a right hand QWP and having the second input optical rotator 432 include a left hand QWP, as indicated in FIG. 4. Alternatively, the first input optical rotator 418 may include a left hand QWP and the second input optical rotator 432 may include a right hand QWP. Because the first circularly polarized component and the second circularly polarized component both originate from the single signal emitter 416, both circularly polarized components may have a same wavelength and substantially equal intensities, simplifying adjustments to the signal emitter 416 during operation of the integrated sensor 400 compared to having separate signal emitters.

In the instant example, the integrated sensor 400 includes a first signal detector 422 located outside of the first alkali vapor region 404, adjacent to, and within a few millimeters of, the second window 412. A first output optical rotator 424 having a same rotational orientation as the first input optical rotator 418 is located between the first signal detector 422 and the second window 412. A first analyzer 426 is located between the first output optical rotator 424 and the first signal detector 422. The integrated sensor 400 includes a second signal detector 436 located outside of the second alkali vapor region 406, adjacent to, and within a few millimeters of, the second window 412. A second output optical rotator 438 having a same rotational orientation as the second input optical rotator 432 is located between the second signal detector 436 and the second window 412, and a second analyzer 440 is located between the second signal detector 436 and the second output optical rotator 438.

The signal emitter 416, the input signal divider 448, the first input optical rotator 418, the second input optical rotator 432, the first signal detector 422, the first output optical rotator 424, the first analyzer 426, the second signal detector 436, the second output optical rotator 438, and the second analyzer 440 are integrated into the integrated sensor 400. A first signal path 428 extends from the signal emitter 416, through the input signal divider 448, through the first input optical rotator 418, through the first window 410, through the first alkali vapor region 404, through the second window 412, through the first output optical rotator 424, through the first analyzer 426, to the first signal detector 422. A second signal path 442 extends from the signal emitter 416, through the input signal divider 448, through the second input optical rotator 432, through the second window 412, through the second alkali vapor region 406, through the first window 410, through the second output optical rotator 438, through the second analyzer 440, to the second signal detector 436. The first signal path 428 through the first alkali vapor region 404 is parallel to the second signal path 442 through the second alkali vapor region 406. In the instant example. The first signal path 428 through the first alkali vapor region 404 and the second signal path 442 through the second alkali vapor region 406 point in a same direction. The single signal emitter 416 thus provides the functionalities of the first signal emitter 116 and the second signal emitter 130 of FIG. 1. Operation of the integrated sensor 400 may proceed as disclosed in reference to FIG. 1 and FIG. 2, to obtain an estimate of a heading error-free Larmor frequency.

FIG. 5 is a cross section of a further example integrated microfabricated alkali vapor sensor. The integrated microfabricated alkali vapor sensor 500, referred to herein as the integrated sensor 500, includes a sensor cell 502 having a first alkali vapor region 504 and a second alkali vapor region 506. The first alkali vapor region 504 and the second alkali vapor region 506 may be isolated from each other, as depicted in FIG. 5. Alternately, the first alkali vapor region 504 and the second alkali vapor region 506 may be directly adjacent to each other, or in fluid communication with each other. The sensor cell 502 may be implemented with first window sections 510 and second window sections 512 at a location opposite from the first window section 510. The sensor cell 502 may surround the first alkali vapor region 504 and the second alkali vapor region 506, as depicted in FIG. 5. The first window sections 510 and the second window sections 512 may each be exposed to the first alkali vapor region 504 and the second alkali vapor region 506, as depicted in FIG. 5. There may be alkali metal 514, such as cesium or rubidium, disposed in the first alkali vapor region 504 and the second alkali vapor region 506.

In the instant example, the integrated sensor 500 includes a first signal emitter 516 located outside of the first alkali vapor region 504, adjacent to, and within a few millimeters of, one of the first window sections 510. The first signal emitter 516 may be configured to provide a first input signal having a wavelength corresponding to an electron orbital transition in atoms of the alkali metal 514 in a vapor state. A first input optical rotator 518 is located between the first signal emitter 516 and the first window section 510. An optional first linear polarizer 520 may be disposed between the first signal emitter 516 and the first input optical rotator 518.

In the instant example, the integrated sensor 500 includes a second signal emitter 530 located outside of the second alkali vapor region 506, adjacent to, and within a few millimeters of, another of the first window section 510. The second signal emitter 530 may be configured to provide a second input signal having a wavelength equal to the first signal wavelength. A second input optical rotator 532 is located between the second signal emitter 530 and the first window section 510, and optionally a second linear polarizer 534 may be located outside of the second alkali vapor region 506, between the second input optical rotator 532 and the second signal emitter 530.

The second input optical rotator 532 is configured to transform the second input signal from the second signal emitter 530 so that a magnetic field of the second input signal rotates in a rotation direction opposite to the direction of rotation of a magnetic field of the first input signal. In the instant example, the first input optical rotator 518 may be a right hand QWP, and the second input optical rotator 532 may be a left hand QWP, as indicated in FIG. 5, or vice versa.

In the instant example, the integrated sensor 500 includes a single signal detector 522 located outside of the sensor cell 502, adjacent to, and within a few millimeters of, the second window sections 512. A signal multiplexer 550 is located between the signal detector 522 and the second window sections 512. The signal multiplexer 550 provides a structure for alternately directing a first output signal from the first alkali vapor region 504 to the signal detector 522 and directing a second output signal from the second alkali vapor region 506 to the signal detector 522. The signal multiplexer 550 may be implemented as an optical switch 552, for example a switchable micromirror as depicted in FIG. 5, located between a first reflector 554 and a second reflector 556. The first output signal is reflected off the first reflector 554 to the optical switch 552, and from the optical switch 552 to the signal detector 522. Similarly, the second output signal is reflected off the second reflector 556 to the optical switch 552, and from the optical switch 552 to the signal detector 522. Other structures for alternately directing the first output signal and the second output signal to the signal detector 522, for example a Bragg cell, are within the scope of the instant example.

A first output optical rotator 524 having a same rotational orientation as the first input optical rotator 518 is located between the signal multiplexer 550 and the second window section 512. A first analyzer 526 is located between the first output optical rotator 524 and the signal multiplexer 550. A second output optical rotator 538 having a same rotational orientation as the second input optical rotator 532 is located between the signal multiplexer 550 and the second window section 512. A second analyzer 540 is located between the signal multiplexer 550 and the second output optical rotator 538.

The first signal emitter 516, the first linear polarizer 520, the first input optical rotator 518, the second signal emitter 530, the second linear polarizer 534, the second input optical rotator 532, the first output optical rotator 524, the first analyzer 526, the second output optical rotator 538, the second analyzer 540, the signal multiplexer 550 and the signal detector 522 are integrated into the integrated sensor 500. A first signal path 528 extends from the first signal emitter 516, through the first linear polarizer 520, through the first input optical rotator 518, through the first window section 510, through the first alkali vapor region 504, through the second window section 512, through the first output optical rotator 524, through the first analyzer 526, through the signal multiplexer 550, and to the signal detector 522. A second signal path 542 extends from the second signal emitter 530, through second linear polarizer 534, through the second input optical rotator 532, through the first window section 510, through the second alkali vapor region 506, through the second window section 512, through the second output optical rotator 538, through the second analyzer 540, through the signal multiplexer 550, and to the signal detector 522. The first signal path 528 through the first alkali vapor region 504 is parallel to the second signal path 542 through the second alkali vapor region 506. In the instant example. The first signal path 528 through the first alkali vapor region 504 and the second signal path 542 through the second alkali vapor region 506 point in a same direction.

Signal detectors in integrated microfabricated alkali vapor sensors extend over significant fractions of lateral dimensions of the sensor cells, to detect a desired component of output signals from the alkali vapor regions. Integrating two laterally adjacent signal detectors entails a tradeoff between detecting desired components of the output signals and maintaining a desired form factor for the integrated sensor package. Having the single signal detector 522 may enable obtaining a desired signal detection while keeping the form factor within desired limits.

During operation of the integrated sensor 500, the first input signal from the first signal emitter 516, and the second input signal from the second signal emitter 530, are modulated through a range of frequencies. The first output signal from the first alkali vapor region 504 is transformed by the first output optical rotator 524 to a linearly polarized state, a component of which is passed by the first analyzer 526 to the signal multiplexer 550. Similarly, the second output signal from the second alkali vapor region 506 is transformed by the second output optical rotator 538 to a linearly polarized state, a component of which is passed by the second analyzer 540 to the signal multiplexer 550. The signal multiplexer 550 alternately directs the passed components of the first output signal and the second output signal to the signal detector 522, which alternately provides a first electrical signal corresponding to the passed component of the first output signal and a second electrical signal corresponding to the passed component of the second output signal. The single signal detector 522 thus provides the functionalities of the first signal detector 122 and the second signal detector 136 of FIG. 1. A first Larmor frequency is estimated from the first electrical signal, and a second Larmor frequency is estimated from the second electrical signal, as explained in reference to FIG. 2. The estimated first Larmor frequency and the estimated second Larmor frequency are used to obtain an estimate of a heading error-free Larmor frequency.

FIG. 6 is a flowchart of an example method of operating an integrated sensor. The method 600 includes step 602 which is to operate a first signal emitter of the integrated sensor so as to modulate a first input signal through a range of frequencies, wherein the first input signal having a first rotation direction is directed into a first alkali vapor region of the integrated sensor. The first rotation direction is a rotation direction of a magnetic component of the first input signal. The first alkali vapor region includes alkali atoms in a vapor state. The first input signal may include an optical signal having a wavelength corresponding to an electron orbital transition in the alkali atoms. The first signal may be modulated through a range of frequencies centered around a frequency corresponding to a difference in energy levels of a hyperfine split of the alkali atoms in a ground state.

Step 604 of the method 600 is to operate a first signal detector of the integrated sensor so as to detect a first output signal from the first alkali vapor region and output a first electrical signal corresponding to the first output signal. The first signal detector may include a photodiode.

The method 600 includes step 606 which is to operate a second signal emitter of the integrated sensor so as to modulate a second input signal through the same range of frequencies, wherein the second input signal having a second rotation direction, opposite from the first rotation direction, is directed into a second alkali vapor region of the integrated sensor. The second rotation direction is a rotation direction of a magnetic component of the second input signal. The second alkali vapor region includes alkali atoms in a vapor state. The first alkali vapor region and the second alkali vapor region are contained in a sensor cell of the integrated sensor. The second input signal may include an optical signal having a wavelength close to that of the first input signal. The second input signal may be modulated through the same range of as the first input signal. A first direction of the first input signal into the first alkali vapor region is parallel to a second direction of the second input signal into the second alkali vapor region.

Step 608 of the method 600 is to operate a second signal detector of the integrated sensor so as to detect a second output signal from the second alkali vapor region and output a second electrical signal corresponding to the second output signal. The second signal detector may include a photodiode similar to that of the first signal detector.

Step 610 of the method 600 is to estimate a heading error-free Larmor frequency using the first electrical signal and the second electrical signal. For example, a first Larmor frequency may be estimated as a modulation frequency of the first input signal which produces an extremum, that is, a minimum or a maximum, of the first electrical signal. Similarly, a second Larmor frequency may be estimated as a modulation frequency of the second input signal which produces an extremum of the second electrical signal. The heading error-free Larmor frequency may then be estimated as an average of the first Larmor frequency and the second Larmor frequency.

While various embodiments of the present disclosure have been described above, it should be understood that they have been presented by way of example only and not limitation. Numerous changes to the disclosed embodiments can be made in accordance with the disclosure herein without departing from the spirit or scope of the disclosure. Thus, the breadth and scope of the present invention should not be limited by any of the above described embodiments. Rather, the scope of the disclosure should be defined in accordance with the following claims and their equivalents.

What is claimed is:

1. An integrated microfabricated sensor, comprising:
   a sensor cell having a first alkali vapor region and a second alkali vapor region, wherein the first alkali vapor region and the second alkali vapor region are isolated from each other by a portion of the sensor cell;
   a first input optical rotator in a first signal path that extends through the first alkali vapor region;
   a second input optical rotator in a second signal path that extends through the second alkali vapor region;
   a first signal emitter at a first end of the first signal path;
   a second signal emitter at a first end of the second signal path;
   a first signal detector at a second end of the first signal path; and
   a second signal detector at a second end of the second signal path;
   wherein:
      the first signal path through the first alkali vapor region is spaced from and parallel to the second signal path through the second alkali vapor region; and
      the first input optical rotator is configured to provide a first rotation direction in the first alkali vapor region and the second input optical rotator is configured to provide a second rotation direction, opposite from the first rotation direction, in the second alkali vapor region.

2. The integrated microfabricated sensor of claim 1, wherein the first signal path through the first alkali vapor region and the second signal path through the second alkali vapor region point in a same direction.

3. The integrated microfabricated sensor of claim 1, wherein the first signal path through the first alkali vapor region and the second signal path through the second alkali vapor region point in opposite directions.

4. The integrated microfabricated sensor of claim 1, wherein the first input optical rotator includes a first quarter wave plate, and the second input optical rotator includes a second quarter wave plate.

5. The integrated microfabricated sensor of claim 1, further comprising:
   a first linear polarizer in the first signal path located adjacent to the first input optical rotator; and
   a second linear polarizer in the second signal path located adjacent to the second input optical rotator.

6. The integrated microfabricated sensor of claim 1, further comprising:
   a first output optical rotator in the first signal path; and
   a second output optical rotator in the second signal path.

7. The integrated microfabricated sensor of claim 1, wherein the first signal emitter and the second signal emitter are located on a same side of the sensor cell.

8. The integrated microfabricated sensor of claim 1, wherein the first signal emitter and the second signal emitter are located on opposite sides of the sensor cell.

9. The integrated microfabricated sensor of claim 1, wherein the first signal detector and the second signal detector are located on a same side of the sensor cell.

10. The integrated microfabricated sensor of claim 1, wherein the first signal detector and the second signal detector are located on opposite sides of the sensor cell.

11. The integrated microfabricated sensor of claim 1, further comprising:
a signal emitter including a vertical cavity surface emitting laser (VCSEL); and
a signal detector including a photodiode.

12. The integrated microfabricated sensor of claim 1, further comprising an alkali metal in the first alkali vapor region and the second alkali vapor region, the alkali metal being selected from the group consisting of cesium and rubidium.

13. The integrated microfabricated sensor of claim 1, wherein the first alkali vapor region is in fluid communication with the second alkali vapor region.

14. An integrated microfabricated sensor, comprising:
a sensor cell having a first alkali vapor region and a second alkali vapor region;
a first input optical rotator in a first signal path that extends through the first alkali vapor region;
a second input optical rotator in a second signal path that extends through the second alkali vapor region;
wherein:
the first signal path through the first alkali vapor region is parallel to the second signal path through the second alkali vapor region;
the first input optical rotator is configured to provide a first rotation direction in the first alkali vapor region and the second input optical rotator is configured to provide a second rotation direction, opposite from the first rotation direction, in the second alkali vapor region;
a first output optical rotator in the first signal path;
a second output optical rotator in the second signal path;
a first analyzer in the first signal path located adjacent to the first output optical rotator; and
a second analyzer in the second signal path located adjacent to the second output optical rotator.

15. The integrated microfabricated sensor of claim 14, wherein the first signal path through the first alkali vapor region and the second signal path through the second alkali vapor region point in a same direction.

16. The integrated microfabricated sensor of claim 14, wherein the first signal path through the first alkali vapor region and the second signal path through the second alkali vapor region point in opposite directions.

17. The integrated microfabricated sensor of claim 14, wherein the first input optical rotator includes a first quarter wave plate, and the second input optical rotator includes a second quarter wave plate.

18. The integrated microfabricated sensor of claim 14, further comprising:
a first linear polarizer in the first signal path located adjacent to the first input optical rotator; and
a second linear polarizer in the second signal path located adjacent to the second input optical rotator.

19. The integrated microfabricated sensor of claim 14, further comprising:
a first signal emitter at one end of the first signal path; and
a second signal emitter at one end of the second signal path.

20. The integrated microfabricated sensor of claim 14, further comprising:
a first signal detector at one end of the first signal path; and
a second signal detector at one end of the second signal path.

21. The integrated microfabricated sensor of claim 14, further comprising:
a signal emitter including a vertical cavity surface emitting laser (VCSEL); and
a signal detector including a photodiode.

22. The integrated microfabricated sensor of claim 14, further comprising an alkali metal in the first alkali vapor region and the second alkali vapor region, the alkali metal being selected from the group consisting of cesium and rubidium.

23. An integrated microfabricated sensor, comprising:
a sensor cell having a first alkali vapor region and a second alkali vapor region;
a first input optical rotator in a first signal path that extends through the first alkali vapor region;
a second input optical rotator in a second signal path that extends through the second alkali vapor region;
wherein:
the first signal path through the first alkali vapor region is parallel to the second signal path through the second alkali vapor region;
the first input optical rotator is configured to provide a first rotation direction in the first alkali vapor region and the second input optical rotator is configured to provide a second rotation direction, opposite from the first rotation direction, in the second alkali vapor region; and
a single signal emitter configured to provide an input signal into an input signal divider, wherein the input signal divider is configured to provide a first component of the input signal to the first input optical rotator, and to provide a second component of the input signal to the second input optical rotator.

24. The integrated microfabricated sensor of claim 23, wherein the input signal divider includes a polarizing beamsplitter.

25. An integrated microfabricated sensor, comprising:
a sensor cell having a first alkali vapor region and a second alkali vapor region;
a first input optical rotator in a first signal path that extends through the first alkali vapor region;
a second input optical rotator in a second signal path that extends through the second alkali vapor region;
wherein:
the first signal path through the first alkali vapor region is parallel to the second signal path through the second alkali vapor region;
the first input optical rotator is configured to provide a first rotation direction in the first alkali vapor region and the second input optical rotator is configured to provide a second rotation direction, opposite from the first rotation direction, in the second alkali vapor region; and
a single signal detector and a signal multiplexer, wherein the signal multiplexer is configured to alternately direct a component of a first output signal from the first alkali vapor region to the signal detector and direct a component of a second output signal from the second alkali vapor region to the signal detector.

26. A method, comprising:
operating a first signal emitter so as to modulate a first input signal through a range of frequencies, wherein the first input signal having a first rotation direction of a magnetic component of the first input signal is directed into a first alkali vapor region of an integrated sensor;

operating a first signal detector so as to detect a first output signal from the first alkali vapor region and output a first electrical signal corresponding to the first output signal;

operating a second signal emitter so as to modulate a second input signal through the range of frequencies, wherein the second input signal having a second rotation direction of a magnetic component of the second input signal, opposite from the first rotation direction, is directed into a second alkali vapor region of the integrated sensor, wherein a first direction of the first input signal into the first alkali vapor region is parallel to a second direction of the second input signal into the second alkali vapor region;

operating a second signal detector so as to detect a second output signal from the second alkali vapor region and output a second electrical signal corresponding to the second output signal; and estimating a heading error-free Larmor frequency using the first electrical signal and the second electrical signal.

27. An integrated microfabricated sensor, comprising:
a sensor cell having a first alkali vapor region and a second alkali vapor region;
a first input optical rotator in a first signal path that extends through the first alkali vapor region;
a second input optical rotator in a second signal path that extends through the second alkali vapor region;
a first signal emitter at a first end of the first signal path;
a second signal emitter at a first end of the second signal path;
a first signal detector at a second end of the first signal path; and
a second signal detector at a second end of the second signal path;

wherein:
the first signal path through the first alkali vapor region is spaced from and parallel to the second signal path through the second alkali vapor region; and
the first input optical rotator is configured to provide a first rotation direction in the first alkali vapor region and the second input optical rotator is configured to provide a second rotation direction, opposite from the first rotation direction, in the second alkali vapor region.

28. An integrated microfabricated sensor, comprising:
a sensor cell having a first alkali vapor region and a second alkali vapor region;
a first input optical rotator in a first signal path that extends through the first alkali vapor region;
a second input optical rotator in a second signal path that extends through the second alkali vapor region; and
a signal detection structure that includes at least one signal detector, the signal detection system being configured to detect a first optical signal in the first signal path independently of a second optical signal in the second signal path, and to detect the second optical signal in the second signal path independently of the first optical signal;

wherein:
the first signal path through the first alkali vapor region is spaced from and parallel to the second signal path through the second alkali vapor region;
the first input optical rotator is configured to provide a first rotation direction in the first alkali vapor region and the second input optical rotator is configured to provide a second rotation direction, opposite from the first rotation direction, in the second alkali vapor region.

* * * * *